(12) United States Patent
Lee et al.

(10) Patent No.: US 10,861,723 B2
(45) Date of Patent: Dec. 8, 2020

(54) EFEM ROBOT AUTO TEACHING METHODOLOGY

(71) Applicant: Taiwan Semiconductor Manufacturing Co., Ltd., Hsin-Chu (TW)

(72) Inventors: Chien-Fa Lee, Hsinchu (TW); Hsu-Shui Liu, Pingjhen (TW); Jiun-Rong Pai, Jhubei (TW); Shou-Wen Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 333 days.

(21) Appl. No.: 15/822,865

(22) Filed: Nov. 27, 2017

(65) Prior Publication Data

US 2019/0051546 A1 Feb. 14, 2019

Related U.S. Application Data

(60) Provisional application No. 62/542,468, filed on Aug. 8, 2017.

(51) Int. Cl.
*H01L 21/67* (2006.01)
*H01L 21/677* (2006.01)
(Continued)

(52) U.S. Cl.
CPC .. *H01L 21/67201* (2013.01); *H01L 21/67259* (2013.01); *H01L 21/67766* (2013.01);
(Continued)

(58) Field of Classification Search
USPC .................................................. 700/245–264
See application file for complete search history.

(56) References Cited

U.S. PATENT DOCUMENTS

| 5,483,138 | A | * | 1/1996 | Shmookler | ........... H01L 21/681 318/568.16 |
| 5,742,393 | A | * | 4/1998 | Landau | ................. H01L 21/681 356/620 |

(Continued)

FOREIGN PATENT DOCUMENTS

| JP | H11243131 A | 9/1999 |
| JP | 3208467 B2 | 9/2001 |

OTHER PUBLICATIONS

FALA Technologies. "Introduction to EFEM." Retrieved online on Jul. 31, 2017 from http://www.falatech.com/page.asp?pageid=45.

*Primary Examiner* — Jonathan L Sample (74) *Attorney, Agent, or Firm* — Eschweiler & Potashnik, LLC (57) ABSTRACT

The present disclosure relates to a method of automatically re-programming an EFEM to account for positional changes of the EFEM robot. In some embodiments, the method is performed by determining an initial position of an EFEM robot within an EFEM chamber. The EFEM robot at the initial position moves along a first plurality of steps defined relative to the initial position and that extend along a path between a first position and a second position. Positional parameters are determined, which describe a change between an initial position and a new position of the EFEM robot that is different than the initial position. A second plurality of steps are determined based upon the positional parameters. The EFEM robot at the new position moves along the second plurality of steps defined relative to the new position and that extend along the path between the first position and the second position.

20 Claims, 7 Drawing Sheets

(51) Int. Cl.
  *H01L 21/68*    (2006.01)
  *H01L 21/687*   (2006.01)
(52) U.S. Cl.
  CPC ...... *H01L 21/67775* (2013.01); *H01L 21/681*
       (2013.01); *H01L 21/68707* (2013.01)

(56) References Cited

U.S. PATENT DOCUMENTS

| | | | | |
|---|---|---|---|---|
| 6,198,976 | B1* | 3/2001 | Sundar | H01L 21/681 700/121 |
| 6,353,312 | B1* | 3/2002 | Farnworth | G01R 31/2851 324/750.23 |
| 6,401,554 | B1* | 6/2002 | Mori | H01L 21/681 73/865.9 |
| 6,428,673 | B1* | 8/2002 | Ritzdorf | C25D 21/12 204/228.7 |
| 6,453,214 | B1* | 9/2002 | Bacchi | H01L 21/68707 700/245 |
| 6,502,054 | B1* | 12/2002 | Mooring | G05B 19/4083 702/149 |
| 6,629,053 | B1* | 9/2003 | Mooring | G05B 19/401 702/149 |
| 6,856,863 | B1* | 2/2005 | Sundar | B25J 9/1692 318/568.1 |
| 7,066,707 | B1* | 6/2006 | Bonora | H01L 21/67766 414/744.3 |
| 7,604,449 | B1* | 10/2009 | Kaveh | H01L 21/67201 414/411 |
| 2002/0068992 | A1* | 6/2002 | Hine | H01L 21/68707 700/229 |
| 2003/0060922 | A1* | 3/2003 | Schauer | B23Q 3/186 700/213 |
| 2003/0154002 | A1* | 8/2003 | Lappen | H01L 21/67775 700/218 |
| 2003/0202092 | A1* | 10/2003 | Sadighi | B25J 9/1697 348/87 |
| 2004/0151574 | A1* | 8/2004 | Lu | H01L 21/681 414/816 |
| 2006/0130750 | A1* | 6/2006 | Ishikawa | H01L 21/67173 118/300 |
| 2009/0062959 | A1* | 3/2009 | Sakhare | G01B 11/03 700/254 |
| 2009/0118862 | A1* | 5/2009 | Genetti | B25J 9/1694 700/254 |
| 2009/0279989 | A1* | 11/2009 | Wong | H01L 21/68 414/217 |
| 2012/0002216 | A1* | 1/2012 | Shibata | H01L 21/681 356/614 |
| 2013/0325179 | A1* | 12/2013 | Liao | H01L 21/67259 700/254 |
| 2014/0072397 | A1* | 3/2014 | Mooring | H01L 21/67161 414/805 |
| 2015/0179491 | A1* | 6/2015 | Katsuda | H01L 21/67742 700/213 |
| 2015/0253765 | A1* | 9/2015 | Katsuda | H01L 21/67766 700/121 |
| 2016/0133502 | A1* | 5/2016 | Won | H01L 21/68707 700/253 |
| 2017/0113344 | A1* | 4/2017 | Schonberg | B25J 9/163 |
| 2017/0170044 | A1* | 6/2017 | Okabe | H01L 21/67393 |
| 2017/0190053 | A1* | 7/2017 | Xu | B25J 11/095 |
| 2017/0194183 | A1* | 7/2017 | Xu | H01L 21/68707 |
| 2017/0194187 | A1* | 7/2017 | Xu | H01L 21/67265 |
| 2018/0012789 | A1* | 1/2018 | Handa | B25J 13/088 |
| 2019/0051546 | A1* | 2/2019 | Lee | H01L 21/67775 |

* cited by examiner

EFEM ROBOT AUTO TEACHING METHODOLOGY

REFERENCE TO RELATED APPLICATION

This Application claims priority to U.S. Provisional Application No. 62/542,468 filed on Aug. 8, 2017, the contents of which are hereby incorporated by reference in their entirety.

BACKGROUND

Semiconductor fabrication facilities (FAB s) are factories where integrated chips are manufactured. The fabrication of integrated chips is performed by operating upon a semiconductor wafer with a plurality of fabrication processes (e.g., etching steps, patterning steps, deposition steps, implantation steps, etc.) to form millions or billions of semiconductor devices on and within the semiconductor wafer.

During such fabrication processes, contact between an integrated chip and the outside world is minimized to reduce contaminants that come into contact with the integrated chip and to thereby improve yield. For example, integrated chips are fabricated in clean rooms that have low levels of contaminant particles (e.g., dust) that could be harmful to an integrated chip. Furthermore, human contact with an integrated chip is minimized during fabrication processes by using wafer transfer robots to transfer semiconductor substrates from one location to another (e.g., between a wafer cassette and a processing tool, or vice versa).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To prevent contamination of integrated chips, substrate transfer robots are often used to move semiconductor substrates within semiconductor processing systems. One common type of substrate transfer robot is an equipment front end module (EFEM) robot. EFEM robots are arranged within an EFEM and are configured to transfer semiconductor substrates and/or photo-masks within semiconductor processing systems. For example, an EFEM robot may transfer a semiconductor substrate between a storage carrier (e.g., a pod cassette, a FOUP, etc.) and a variety of processing, measurement, and/or testing tools. EFEM robots are generally installed for each tool in a FAB, so that in a large FAB the number of EFEM robots may be in the hundreds (e.g., 500 or more).

Over time, EFEM robots are subjected to preventive maintenance to maintain reliable operation. EFEM robots also are subjected to repairs when they do fail to operate properly. Preventive maintenance and repairs may change a position of an EFEM robot within an EFEM chamber. Since the movements of an EFEM robot are fixed with respect to a position of the EFEM robot, such positional changes may result in substrate damage since they also change a path along which the EFEM robot moves substrates. To avoid such damage, an EFEM robot must be re-programmed after a positional change occurs. The re-programming process typically consists of an engineer operating an EFEM robot to slowly move a substrate so as to find new movement commands that define a path of the EFEM robot. However, the re-programming of hundreds of EFEM robots within a FAB can be a costly operation. For example, re-programming often requires a significant time investment (e.g., two or more hours each) by one or more engineers. Furthermore, the re-programming also allows for human errors that can lead to damage of semiconductor substrates.

The present disclosure relates, in some embodiments, to a method of automatically re-programming an EFEM robot to account for positional changes of the EFEM robot, and an associated apparatus. The method comprises determining an initial position of an EFEM robot. When at the initial position, the EFEM robot is configured to operate according to a set of initial movement commands defining a first plurality of steps fixed relative to the initial position. The first plurality of steps move the EFEM robot along a path that extends between first and second positions. After a position of the EFEM robot has changed, positional parameters are determined. The positional parameters describe a change between the initial position and a new position of the EFEM robot that is different than the initial position. A set of new movement commands are generated based upon the positional parameters, and define a second plurality of steps fixed relative to the new position. The EFEM robot is configured to operate according to the set of new movement commands to move along the path between the first position and the second position. By generating new movement commands based upon the positional parameters, positional changes of an EFEM robot (e.g., between the initial position and the new position) can be accounted for without the need for human re-programming, thereby saving time and avoiding damage to substrates.

Figure 1:
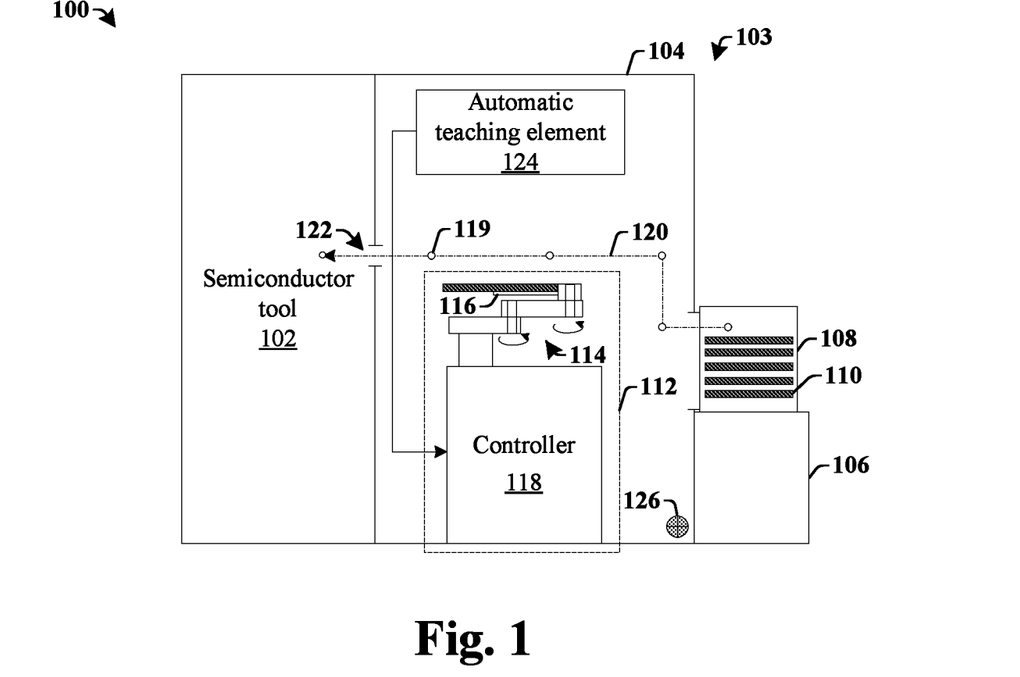
FIG. 1 illustrates a cross-sectional view of some embodiments of a block diagram of a semiconductor processing system comprising an equipment front end module (EFEM) having an EFEM robot.

FIG. 1 illustrates a cross-sectional view of some embodiments of a block diagram of a semiconductor processing system 100 comprising an EFEM robot.

The semiconductor processing system 100 comprises a semiconductor tool 102 coupled to an EFEM (equipment front end module) 103. The semiconductor tool 102 is configured to perform an operation on a substrate. For example, in various embodiments, the semiconductor tool 102 may be a processing tool (e.g., an etching tool, a lithography tool, etc.) configured to perform a fabrication operation (e.g., an etch, a patterning operation, etc.) on a substrate, a measurement tool configured to perform a measurement operation on a substrate, and/or a testing tool configured to perform a testing operation on a substrate. The EFEM 103 comprises an EFEM chamber 104 and an EFEM robot 112. The EFEM chamber 104 comprises an enclosed housing in communication with the semiconductor tool 102. The EFEM chamber 104 is coupled to a load port 106 configured to receive a carrier 108 holding one or more substrates 110. In various embodiments, the carrier 108 may comprise a FOUP (a front opening unified pod), a wafer cassette, or the like. In some embodiments, the one or more substrates 110 may comprise semiconductor wafers (e.g., 200 mm wafers, 300 mm wafers, 450 mm wafers, etc.).

The EFEM robot 112 is arranged within the EFEM chamber 104. The EFEM robot 112 includes a robotic arm 114 having a substrate reception element 116 (e.g., a wafer blade) configured to hold one of the one or more substrates 110. The robotic arm 114 is coupled to a controller 118 that controls movement of the robotic arm 114 within the EFEM chamber 104. The controller 118 is configured to move the substrate reception element 116 along a series of steps 119 defining a path 120 between a first position and a second position. In some embodiments, the path 120 extends between the carrier 108 and an inlet 122 of the semiconductor tool 102. The series of steps 119 are fixed within respect to the EFEM robot 112. Since the series of steps 119 are fixed with respect to the EFEM robot 112, a positional change of the EFEM robot 112 will cause a change in the path 120 defined by the series of steps 119. In some embodiments, the series of steps 119 are defined by a series of movement commands that operate the controller 118 to move the robotic arm 114.

An automatic teaching element 124 is also arranged within the EFEM chamber 104. The automatic teaching element 124 comprises one or more sensors that are configured to determine positional parameters describing a change in location of the EFEM robot 112 between an initial position and a new position. In some embodiments, the positional parameters may describe the change in location of the EFEM robot 112 by determining a change in a position of a same component of the EFEM robot 112 relative to a position of an alignment mark 126 disposed on the EFEM chamber 104.

The positional parameters may be used to adjust the steps 119 that define the path 120 in a manner that accounts for changes in the position of the EFEM robot 112 (e.g., due to crashes, preventive maintenance, etc.). For example, the positional parameters may be used to adjust a series of movement commands defining the steps 119 to account for the changes in position. By using the positional parameters to adjust the steps 119 defining the path 120, the EFEM robot 112 can be automatically re-programmed to account for positional changes of the EFEM robot 112 without expending the time resources and/or risking product damage associated with human re-programming of the EFEM robot 112.

Figure 2A:
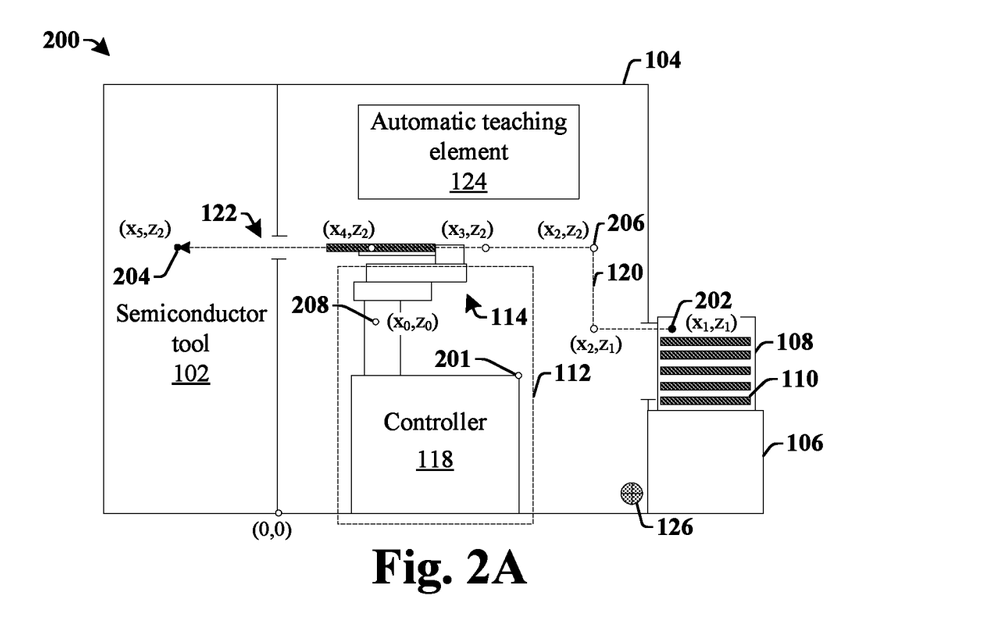
FIGS. 2A-2B illustrate block diagrams showing some embodiments of the operation of the semiconductor processing system of FIG. 1 before and after occurrence of an event that modifies a position of an EFEM robot.
Figure 2B:
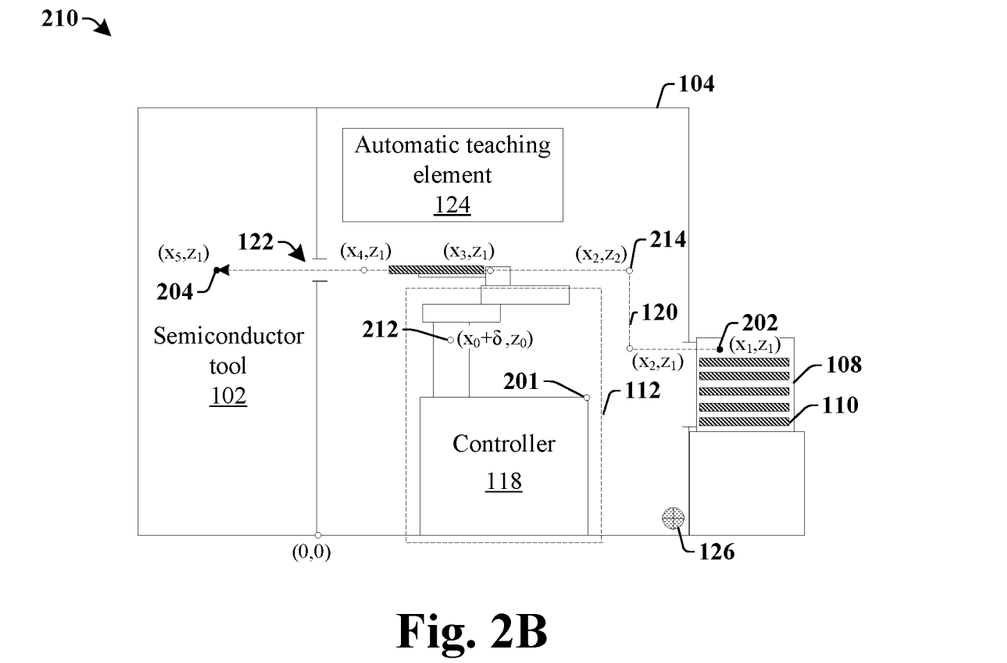

FIGS. 2A-2B illustrate block diagrams showing some embodiments of the operation of the semiconductor processing system 100 of FIG. 1 before and after occurrence of an event that modifies a position of an EFEM robot.

FIG. 2A illustrates a block diagram 200 showing operation of an EFEM robot 112 prior to occurrence of an event that modifies a position of the EFEM robot 112 (e.g., a crash, earthquake, preventive maintenance, etc.). As shown in block diagram 200, during operation the EFEM robot 112 is configured to move a substrate 110 (e.g., semiconductor wafer) along a path 120 extending between a first position 202 and a second position 204, which are fixed with respect to a fixed reference point (0, 0) tied to an EFEM 104 chamber.

In some embodiments, the EFEM robot 112 is configured to move the substrate 110 according to a series of initial movement commands that move a robotic arm 114 of the EFEM robot 112 along a first plurality of steps 206 that are fixed with respect to a position 201 on the EFEM robot 112. For example, if the EFEM robot 112 has an initial position 208 of ($x_0$, $z_0$) with reference to the fixed reference point (0,0), the series of initial movement commands will cause the EFEM robot 112 to move the robotic arm 114 along a first plurality of steps 206 that are fixed relative to the initial position of ($x_0$, $z_0$). In some embodiments, during a first one of the first plurality of steps 206 the EFEM robot 112 will receive the substrate 110 at a first position of ($x_1$, $z_1$). During a second one of the first plurality of steps 206, the EFEM robot 112 will move the substrate 110 to a second position of ($x_2$, $z_1$). The first position of ($x_1$, $z_1$) is separated from the initial position 208 of ($x_0$, $z_0$) by a first distance of ($x_1$-$x_0$, $z_1$-$z_0$) and the second position of ($x_2$, $z_1$) is separated from the initial position 208 of ($x_0$, $z_0$) by a second distance of ($x_2$-$x_0$, $z_1$-$z_0$). In some embodiments, the first plurality of steps 206 will move the substrate 110 along the path 120 from the carrier 108 located at the first position 202 of ($x_1$, $z_1$) to an inlet 122 of a semiconductor tool 102 located at the second position 204 of ($x_5$, $z_2$) without damaging the substrate 110 (e.g., scraping the substrate).

FIG. 2B illustrates a block diagram 210 of the EFEM robot 112 after an event has changed a position of the EFEM robot 112 from the initial position of ($x_0$, $z_0$) to a new position of ($x_0+\delta$, $z_0$). The series of initial movement commands are still configured to cause the EFEM robot 112 to move the robotic arm 114 of the EFEM robot 112 along the first plurality of steps 206 that are fixed with respect to the position 201 on the EFEM robot 112. However, because the position of the EFEM robot 112 has changed, the series of initial movement commands will no longer move the substrate 110 along the path 120 that extends between the first position 202 of ($x_1$, $z_1$) and the second position 204 of ($x_5$, $z_2$). Rather, if the EFEM robot 112 is at the new position 212 of ($x_0+\delta$, $z_0$), the series of initial movement commands will cause the EFEM robot 112 to move a substrate 110 along a path extending between ($x_0+\delta$, $z_0$) and ($x_0+\delta$, $z_0$), thereby resulting in an error in the movement of the substrate 110. The error can cause costly damage (e.g., scrapping) to the substrate 110.

To account for this error, an automatic teaching element 124 is configured to determine positional parameters describing a change between the initial position (208 of FIG. 2A) and the new position 212 of the EFEM robot 112. The automatic teaching element 124 is further configured to use the positional parameters to generate a series of new movement commands. In some embodiments, the automatic teaching element 124 may additionally use the initial position (208 of FIG. 2A) of the EFEM robot 112 to generate the series of new movement commands. The series of new movement commands take into account positional changes of the EFEM 112 to change separations (i.e., distances) between the point 201 on the EFEM robot 112 and steps of the EFEM robot 112.

In some embodiments, the series of initial movement commands may define the first plurality of steps 206 separated from the point 201 of the EFEM robot having the initial position 208 of ($x_0$, $z_0$) by a first plurality of distances, while the series of new movement commands may define a second plurality of steps 214 separated from the point 201 of the EFEM robot 112 having the new position of ($x_0+\delta$, $z_0$) by a second plurality of distances different than the first plurality of distances. The changes in the separation between the point 201 on the EFEM robot 112 and the steps causes the second plurality of steps 214 to move the substrate 110 along the path 120 that will not damage the substrate 110.

For example, during a first one of the second plurality of steps 214, the EFEM robot 112 will receive the substrate 110 at the first position 202 of ($x_1$, $z_1$). The first position 202 of ($x_1$, $z_1$) is separated from the new position 212 of ($x_0+\delta$, $z_0$) by a first distance of ($x_1-(x_0+\delta)$, $z_1-z_0$)=($x_1-x_0-\delta$, $z_1-z_0$). During a second one of the second plurality of steps 214, the EFEM robot 112 will move the substrate 110 to a second position 204 of ($x_2$, $z_1$). The second position 204 is separated from the new position 212 of ($x_0+\delta$, $z_0$) by a second distance of ($x_2-(x_0+\delta)$, $z_1-z_0$)=($x_2-x_0-\delta$, $z_1-z_0$).

Therefore, by operating the automatic teaching element 124 to determine positional changes of the EFEM robot 112, the automatic teaching element 124 is able to automatically generate a set of new movement commands (i.e., without manual adjustment) that are able to change operation of the EFEM robot 112 to account for changes that may occur during an event that modifies a position of the EFEM robot 112.

Figure 3:
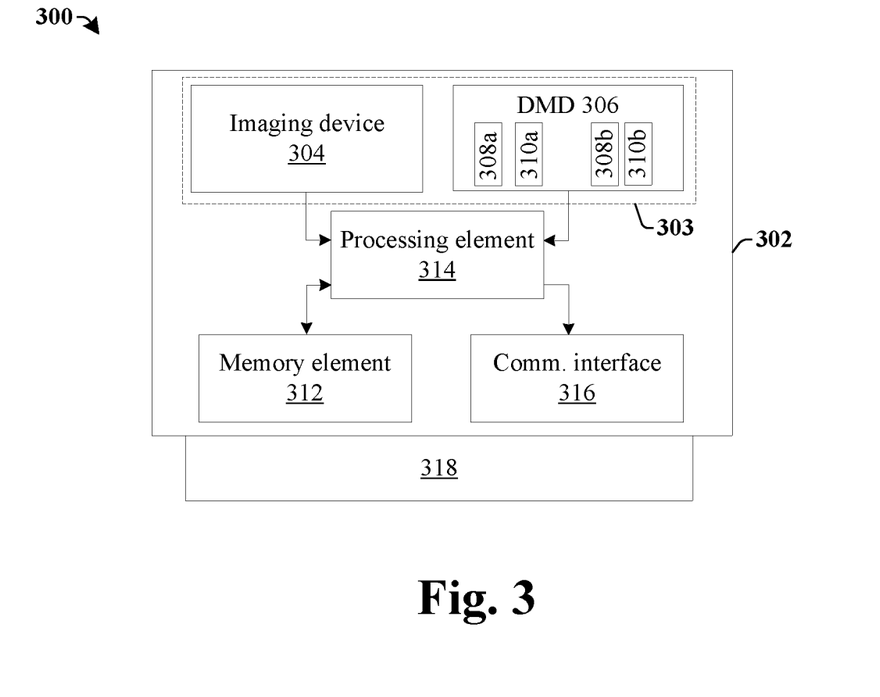
FIG. 3 illustrates a block diagram of some embodiments of an automatic teaching element configured to determine positional parameters describing a position of an EFEM robot.

FIG. 3 illustrates a block diagram of some embodiments of an automatic teaching element 300 (e.g., corresponding to automatic teaching element 124) configured to determine positional parameters describing a position of an EFEM robot.

The automatic teaching element 300 comprises a housing 302 surrounding a position measurement unit 303 configured to take measurements describing positions of an EFEM robot (e.g., 112 of FIG. 1) at different positions within an EFEM chamber (e.g., 104 of FIG. 1). The measurements can be used to determine an initial position of the EFEM robot within the EFEM chamber and positional parameters describing a change between the initial position and a new position of the EFEM robot within the EFEM chamber.

In some embodiments, the position measurement unit 303 may comprise an imaging device 304 and a distance measurement device 306. The imaging device 304 is configured to capture one or more images corresponding to the EFEM chamber from different positions of the EFEM robot within the EFEM chamber. From the images, a first positional parameter $p_1$ and a second positional parameter $p_2$ can be determined. The first positional parameter $p_1$ describes a change in the location of the EFEM robot in a first direction (e.g., in an x-coordinate). The second positional parameter $p_2$ describes a change in the location of the EFEM robot in a second direction (e.g., in a z-coordinate). The first direction is perpendicular to the second direction.

The distance measurement device 306 is configured to measure one or more distances between the distance measurement device 306 and the EFEM chamber at different positions of the EFEM robot within the EFEM chamber. From the one or more distances, a third positional parameter $p_3$ can be determined to describe a positional change of the EFEM robot in a third direction (e.g., in a y-coordinate) perpendicular to the first direction and to the second direction. In some embodiments, a fourth positional parameter $p_4$ describing a change in an orientation of the EFEM robot can also be determined from the one or more distances. In other embodiments, the automatic teaching element 300 may comprise an orientation measuring device (not shown) that is arranged within the housing 302 and that is separate and distinct from the distance measurement device 306.

In some embodiments, the imaging device 304 may comprise a CCD (charge coupled device) camera. In some embodiments, the distance measurement device 306 may comprise a pair of lasers, 308a and 308b, and associated sensors, 310a and 310b. The pair of lasers comprise a first laser 308a and a second laser 308b configured to generate laser beams extending along the third direction. The first laser 308a and the second laser 308b are separated along the first direction and/or the second direction.

In some embodiments, the automatic teaching element 300 may further comprise a memory element 312 and a processing element 314. The memory element 312 is configured to store data describing one or more positions of the EFEM robot. In some embodiments, the memory element 312 may store data describing an initial position of the EFEM robot and/or a new position of the EFEM robot. In various embodiments, the memory element 312 may comprise a volatile memory (e.g., SRAM, DRAM, etc.) and/or a non-volatile memory (e.g., flash, etc.).

The processing element 314 is configured to receive the images from the imaging device 304, the distances from the distance measurement device 306, and/or the data describing the initial position of the EFEM robot from the memory element 312. From the images, the distances, and/or the data, the processing element 314 is configured to determine the positional parameters $p_1$-$p_4$. The processing element 314 is further configured to generate a new set of movement commands based upon the positional parameters $p_1$-$p_4$. The new set of movement commands are used to modify operation of the EFEM robot to account for changes in the position of the EFEM robot. In some embodiments, the new set of movement commands may be generated by modifying the set of initial movement commands based on the positional parameters. In other embodiments, the new set of movement commands may be generated from the initial position and the positional parameters.

The set of new movement commands may describe a new plurality of steps defining a path between a first position (e.g., carrier 108 of FIG. 1) and a second position (e.g., inlet 122 of semiconductor tool 102 of FIG. 1). In some embodiments, the set of new movement commands may be provided by a communication interface 316 to a controller (e.g., controller 118 of FIG. 1) configured to control movement of the EFEM robot. In other embodiments, the set of new movement commands may be provided by the communication interface 316 to a teaching pendant that is configured to interface with the controller. In some embodiments, the communication interface 316 may be a wireless interface having a transceiver element configured to wirelessly transmit data. In some embodiments, the automatic teaching element 300 may further comprise a coupling element 318 configured to couple the housing 302 to a surface of an EFEM chamber.

Although, the automatic teaching element 300 of FIG. 3 has been described as having a processing element 314 configured to generate the positional parameters and/or movement commands, in other embodiments, the positional parameters and/or movement commands may be determined by a processing element that is outside of the automatic teaching element 300. For example, in some alternative embodiments, the automatic teaching element 300 may be configured to provide the image and the one or more distances to a teaching pendant or a controller configured to determine the new set of movement commands therefrom. In such embodiments, the teaching pendant or the controller may comprise a memory element configured to store data describing the initial position of the EFEM robot.

Figure 4A:
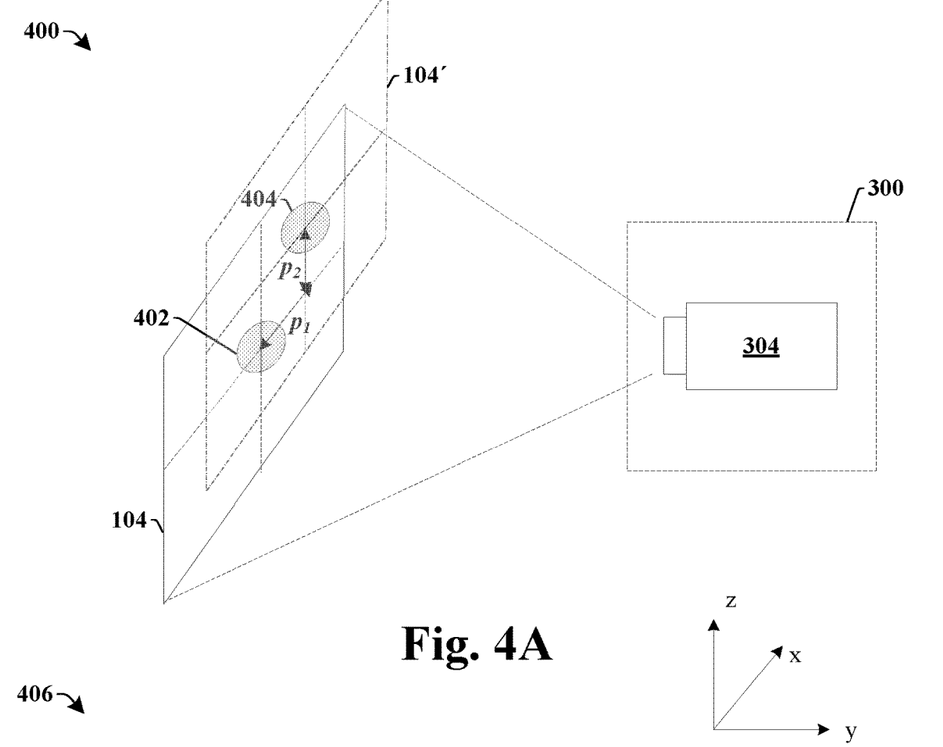
FIGS. 4A-4B illustrate some embodiments of an application of the automatic teaching element of FIG. 3 to determine positional parameters describing a position of an EFEM robot.
Figure 4B:
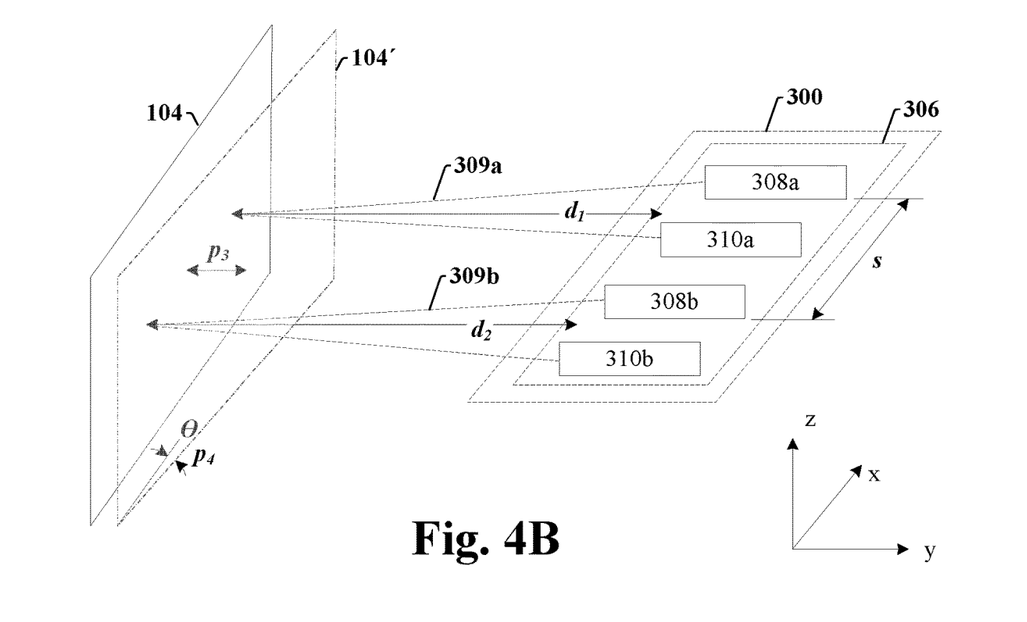

FIGS. 4A-4B illustrate diagrams, 400 and 406, showing some embodiments of an application of the automatic teaching element of FIG. 3 to determine positional parameters of an EFEM robot.

As shown in diagram 400 of FIG. 4A, an automatic teaching element 300 comprises an imaging device 304 configured to capture images of an EFEM chamber 104. In some embodiments, the imaging device 304 is configured to capture the images from a direction perpendicular to a surface of the EFEM chamber 104 that an alignment mark is on, resulting in a top-view of the alignment mark within a plane extending in an x-direction and a z-direction. Within the top-view of the alignment mark, an image showing a position of the alignment mark 402 at an initial position of an EFEM robot (relative to EFEM chamber 104) can be compared to an image showing the alignment mark 404 at a new position of the EFEM robot (relative to EFEM chamber 104') to determine a first positional parameter $p_1$ describing a change in position of the EFEM robot along the x-direction and a second positional parameter $p_2$ describing a change in position of the EFEM robot along the z-direction.

As shown in diagram 406 of FIG. 4B, the automatic teaching element 300 further comprises a distance measurement device 306 configured to measure distances, $d_1$ and $d_2$, along a y-direction. Distances between the automatic teaching element 300 and the EFEM chamber 104 at an initial position of the EFEM robot (relative to EFEM chamber 104) can be compared to distances between the automatic teaching element 300 and the EFEM chamber 104 at a new position of the EFEM robot (relative to EFEM chamber 104') to determine a third positional parameter $p_3$ describing a change in position of the EFEM robot along the y-direction.

In some embodiments, the distance measurement device 306 may comprise a first laser 308a separated from a second laser 308b by a separation s. In such embodiments, the first laser 308a is configured to send a first laser beam 309a that strikes the EFEM chamber 104 when the EFEM robot is at a first position. The first laser beam 309a is reflected from the EFEM chamber 104 to a first sensor 310a, which is configured to determine a first distance $d_1$ to the EFEM chamber 104. The second laser 308b is configured to send a second laser beam 309b that strikes the EFEM chamber 104 when the EFEM robot is at a second position. The second laser beam 309b is reflected from the EFEM chamber 104 to a second sensor 310b, which is configured to determine a second distance $d_2$ to the EFEM chamber 104.

Furthermore, a difference between the first distance $d_1$ and the second distance $d_2$ implies that the EFEM robot is rotated (shown as a relative orientation θ of the EFEM chamber). Therefore, in some embodiments, an orientation θ of the EFEM robot may be calculated as a function of the first distance $d_1$ and the second distance $d_2$. For example, if the first distance $d_1$ is equal to a second distance $d_2$, the EFEM robot is oriented at an orientation of θ=0°. If a difference of the first distance $d_1$ and the second distance $d_2$ is equal to the separation s, the EFEM robot 112 is oriented at an orientation of θ=45°. In some embodiments, the orientation θ may be equal to $\tan^{-1}(d_1-d_2/s)$.

Figure 5A:
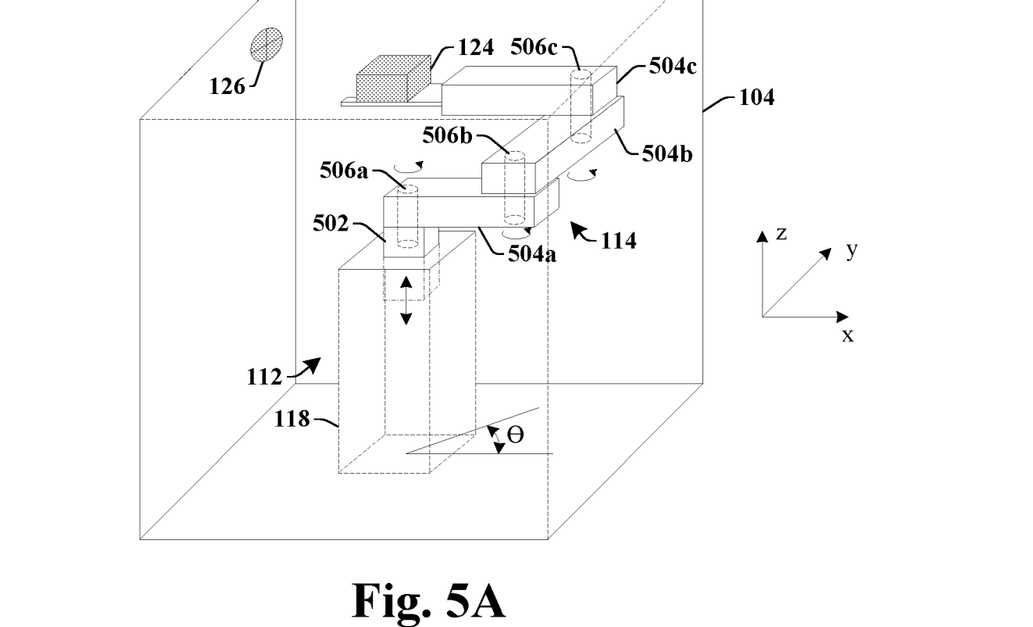
FIGS. 5A-5B illustrates some embodiments of an EFEM in which an automatic teaching element is located at various locations on an EFEM robot.
Figure 5B:
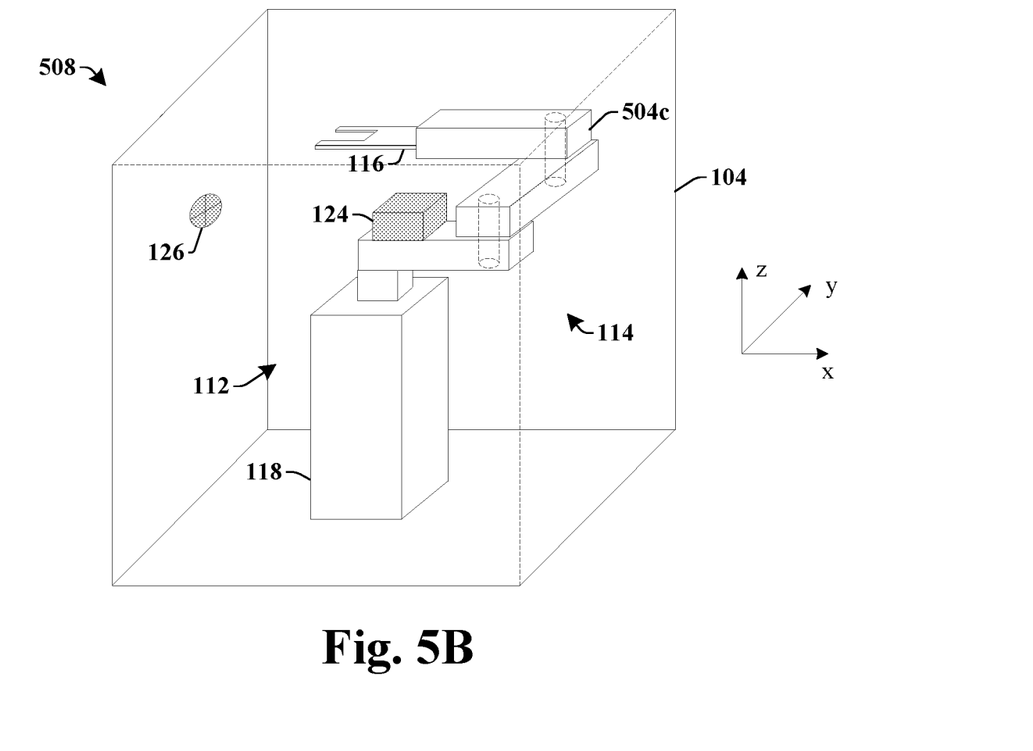

In various embodiments, the automatic teaching element may be configured to be located at different positions in the EFEM chamber and/or on the EFEM robot. FIGS. 5A-5B illustrate some examples of positions at which the automatic teaching element may be located on an EFEM robot. It will be appreciated that the positions shown in FIG. 5A-5B are not limiting but rather are merely examples of the many positions at which the automatic teaching element may be located on an EFEM robot.

FIGS. 5A-5B illustrates some embodiments of a semiconductor processing system 500 in which the automatic teaching element is located on an EFEM robot.

The semiconductor processing system 500 comprises an EFEM robot 112 within an EFEM chamber 104. The EFEM robot 112 has a robotic arm 114 coupled to a controller 118. The robotic arm 114 has a plurality of arm segments 504a-504c configured to move around a plurality of different axes 506a-506c. For example, a first arm segment 504a may move along a first axis 506a, while a second arm segment 504b may move along a second axis 506b that is offset from the first axis 506a. The plurality of arm segments 504a-504c are coupled to a base 502 configured to move along the z-direction.

An alignment mark 126 is disposed to an interior surface of the EFEM chamber 104. In various embodiments, the automatic teaching element 124 may be located along a floor, a sidewall, or a ceiling of the EFEM chamber 104. The automatic teaching element 124 is located on the EFEM robot 112 and faces the alignment mark 126 on the EFEM chamber 104. In various embodiments, the automatic teaching element 124 may be located at various location on the EFEM robot 112. For example, in some embodiments shown in FIG. 5A, the automatic teaching element 124 may be located on a substrate reception element 116 (e.g., a wafer blade) of the EFEM robot 112. In another embodiment shown in FIG. 5B, the automatic teaching element 124 may be located on one of a plurality of arm segments 504a-504c of the EFEM robot 112. In yet another embodiment (not shown), the automatic teaching element 124 may be located on the controller 118 of the EFEM robot 112.

Figure 6:
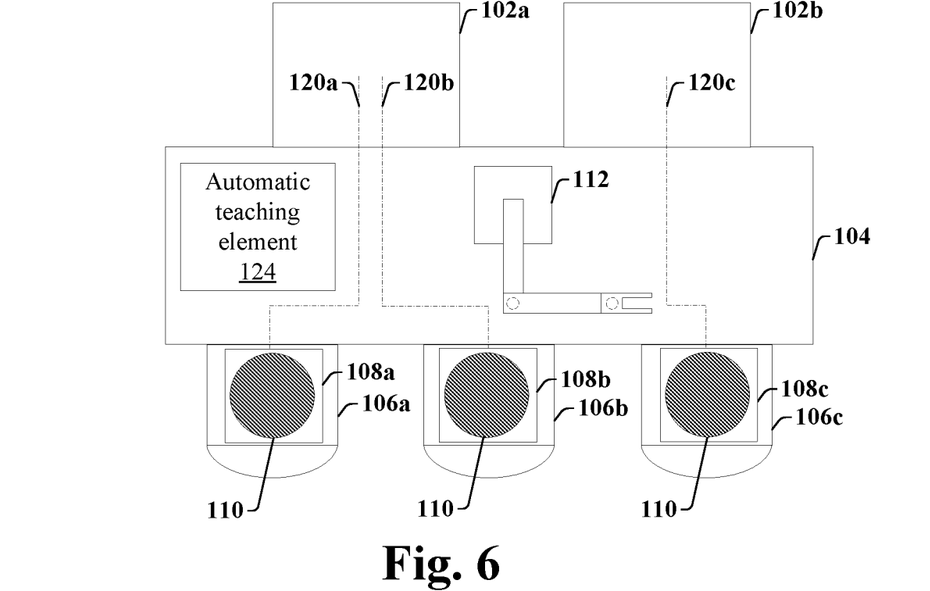
FIG. 6 illustrates a top-view of some additional embodiments of a semiconductor processing system having an EFEM robot within an EFEM having multiple load ports and semiconductor tools.

Although FIGS. 1-5B have described the automatic teaching element as adjusting movement commands for a single substrate path, it will be appreciated that the automatic teaching element may be configured to adjust movement commands for multiple paths within a single EFEM chamber. For example, FIG. 6 illustrates a top-view of some additional embodiments of a semiconductor processing system having an EFEM robot configured to move substrates along multiple paths extending between different semiconductor tools and load ports.

The semiconductor processing system 600 comprises a plurality of semiconductor tools 102a-102b coupled to an EFEM chamber 104 having a plurality of load ports 106a-106c respectively configured to receive one of a plurality of carriers 108a-108c holding one or more substrates 110. An EFEM robot 112 is arranged within the EFEM chamber 104. The EFEM robot 112 is configured to move the one or more substrates 110 along different paths 120a-120c extending between the plurality of carriers 108a-108c and a plurality of semiconductor tools 102a-102b. For example, the EFEM robot 112 may be configured to move substrates along a first path 120a extending between a first carrier 108a and a first semiconductor tool 102a, a second path 120b extending between a second carrier 108b and the first semiconductor tool 102a, and/or a third path 120c extending between a third carrier 108c and a second semiconductor tool 102b.

The different paths 120a-120c are defined by different sets of movement commands. For example, the first path 120a is defined by a first set of movement commands, the second path 120b is defined by a second set of movement commands that is different than the first set of movement commands, and the third path 120c is defined by a third set of movement commands that is different than the first set or the second set of movement commands. The different sets of movement commands respectively define a series of steps that are fixed with respect to a position of the EFEM robot 112.

The automatic teaching element 124 is configured to determine positional parameters describing positional changes of the EFEM robot 112. The positional parameters may be used to adjust the first set of movement commands defining the path 120 to account positional changes of the EFEM robot 112 (e.g., due to crashes, preventive maintenance). The positional parameters may also be used to adjust the second set of movement commands defining the second path 120b and the third set of movement commands defining the third path 120c to account for positional changes of the EFEM robot 112.

Figure 7:
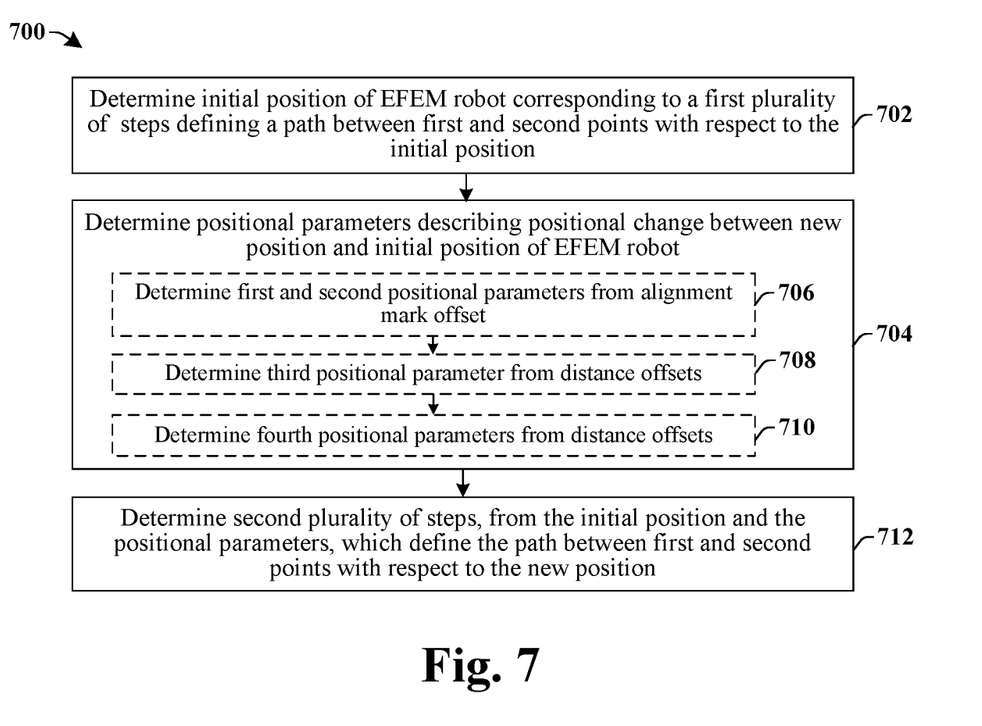
FIG. 7 illustrates a flow diagram of some embodiments of a method of generating a set of movement commands to account for positional changes of an EFEM robot.

FIG. 7 illustrates a flow diagram of some embodiments of a method 700 of generating a set of movement commands to account for positional changes of an EFEM robot.

While the disclosed methods (e.g., methods 700 and 900) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702, an initial position of an EFEM robot is determined. The initial position corresponds to a set of initial movement commands corresponding to a first plurality of steps defining a path between a first position and a second position. The first plurality of steps are fixed with respect to the initial position. FIG. 2A illustrates a cross-sectional view of some embodiments of a block diagram 200 showing an initial position of an EFEM robot corresponding to a first plurality of steps defining a path between first and second positions, according to act 702.

At 704, positional parameters are determined. The positional parameters describe positional changes between the initial position and a new position of the EFEM robot. FIGS. 2A-2B illustrates cross-sectional views of some embodiments of block diagrams, 200 and 210, showing a difference between initial and new positions of an EFEM robot.

In some embodiments, the new positional parameters may be determined based upon acts 706-710.

At 706, first and second positional parameters are determined from an alignment mark offset (i.e., an offset between an alignment mark associated with the initial position and an alignment mark associated with the new position). In some embodiments, the first and second positional parameters may describe positional changes in an x-direction and a z-direction. FIG. 4A illustrates a diagram showing some embodiments of determining first and second positional parameters from an alignment mark offset, according to act 706.

At 708, a third positional parameter is determined from a plurality of distance offsets (i.e., offsets between distances associated with the initial position and distances associated with the new position). In some embodiments, the third positional parameter may describe positional changes in a y-direction. FIG. 4B illustrates a diagram showing some embodiments of determining a third positional parameter from a plurality of distance offsets, according to act 708.

At 710, a difference in a fourth positional parameter is determined from the plurality of distance offsets. In some embodiments, the fourth positional parameters may describe a change in orientation of the EFEM robot. FIG. 4B illustrates a diagram showing some embodiments of determining a fourth positional parameter from a plurality of distance offsets, according to act 710.

At 712, a second plurality of steps are determined from the positional parameters. In some embodiments, the second plurality of steps may be determined from the initial position also. The second plurality of steps extend along the path between the first and second positions and are fixed with respect to the new position. FIG. 2B illustrates a cross-sectional view of some embodiments of a block diagram 210 showing a second plurality of steps within the path between first and second positions, according to act 712.

In some embodiments, the disclosed automatic teaching element may be a portable device that can be moved between different EFEMs. In such embodiments, the automatic teaching element may be used to re-program different EFEM robots within different EFEMs. In some embodiments, the automatic teaching element may be used to re-program different types of EFEM robots (e.g., different EFEM robots made by different manufacturers) within the different EFEMs. By using positional parameters determined by the automatic teaching element to perform EFEM robot re-programming, the different types of EFEM robots can be re-programmed without additional effort.

FIGS. 8A-8D illustrate block diagrams of some embodiments of a method of using a portable automatic teaching element to account for positional changes in an EFEM robot.

Figure 8A:
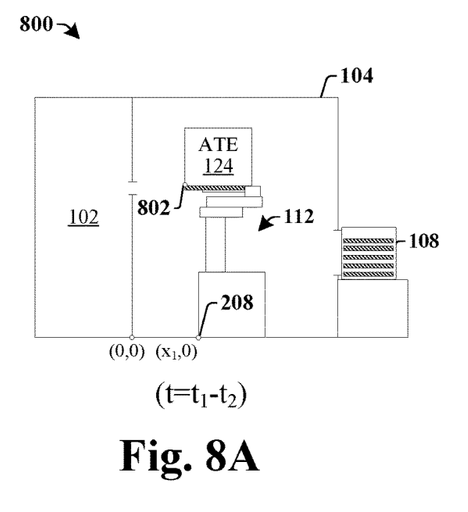
FIGS. 8A-8D illustrate some embodiments of block diagrams showing a method of using a portable automatic teaching element to automatically re-program an EFEM robot to account for positional changes of the EFEM robot.

FIG. 8A illustrates a block diagram of a cross-sectional view 800 of some embodiments of a semiconductor processing system during a first time frame comprising first and second times (i.e., $t_1$-$t_2$).

As shown in cross-sectional view 800 of FIG. 8A, an automatic teaching element 124 is placed at a first location 802 on an EFEM robot 112 within an EFEM chamber 104 at the first time $t_1$. The automatic teaching element 124 is operated at the second time $t_2$ to determine an initial position 208 of ($x_1$, 0) of the EFEM robot 112 with respect to a fixed reference point (e.g., fixed reference point (0, 0)), which is tied to the EFEM chamber 104.

Figure 8B:
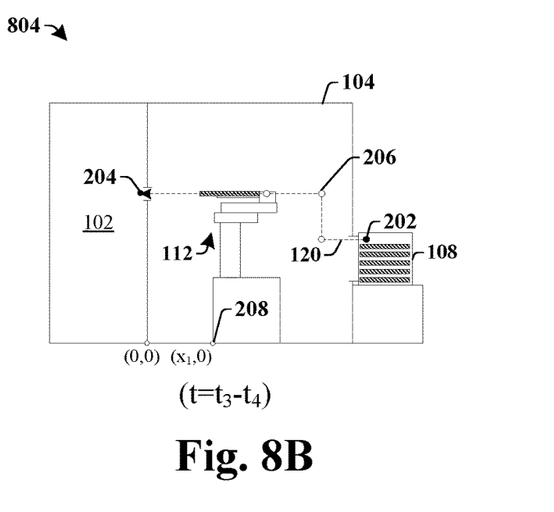

FIG. 8B illustrates a block diagram of a cross-sectional view 804 of some embodiments of a semiconductor processing system during a second time frame comprising third and fourth times (i.e., $t_3$-$t_4$).

As shown in cross-sectional view 804 of FIG. 8B, the automatic teaching element 124 is removed from the EFEM chamber 104 at the third time $t_3$. The EFEM robot 112 is subsequently operated to move along a path 120 extending between a first position 202 within a carrier 108 and a second position 204 within a semiconductor tool 102 at the fourth time $t_4$. The path 120 is defined by a first plurality of steps 206 fixed with respect to the initial position 208 of ($x_1$, 0) of the EFEM robot 112.

Figure 8C:
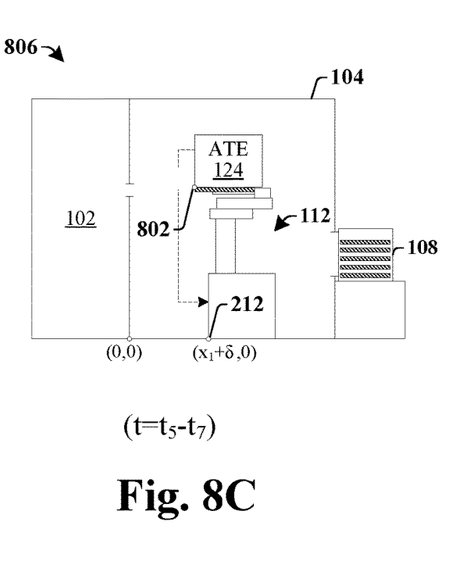

FIG. 8C illustrates a block diagram of a cross-sectional view 806 of some embodiments of a semiconductor processing system during a third time frame comprising fifth, sixth, and seventh times (i.e., $t_5$-$t_7$).

As shown in cross-sectional view 806 of FIG. 8C, after the EFEM robot 112 has moved from the initial position 208 of ($x_1$, 0) to a new position 212 of ($x_1$+δ, 0), the automatic teaching element 124 is placed at the first location 802 on the EFEM robot 112a, the fifth time $t_5$. The automatic teaching element 124 is operated at the sixth time $t_6$ to determine the new position of ($x_1$+δ, 0) of the EFEM robot 112 with respect to the fixed reference point (e.g., fixed reference point (0, 0)). The automatic teaching element 124 subsequently uses the initial position of ($x_1$, 0) and the new position of ($x_1$+δ, 0) to determine positional parameters describing the positional change of the EFEM robot 112. From the positional parameters, the automatic teaching element is configured to generate a set of new movement commands at the seventh time $t_7$. The set of new movement commands are provided to the EFEM robot 112.

Figure 8D:
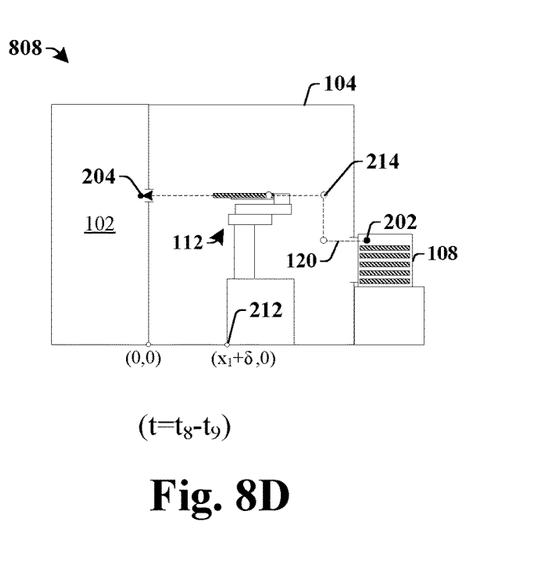

FIG. 8D illustrates a block diagram of a cross-sectional view 808 of some embodiments of a semiconductor processing system during a fourth time frame comprising eighth and ninth times (i.e., $t_8$-$t_9$).

As shown in cross-sectional view 808 of FIG. 8D, the automatic teaching element 124 is removed from the EFEM chamber 104 at the eighth time $t_8$. The EFEM robot 112 is subsequently operated to move along the path 120 according to the set of new movement commands at the ninth time $t_9$. The path 120 is defined by a second plurality of steps 214 fixed with respect to the new position of ($x_1$+δ, 0) of the EFEM robot 112 and extends between the carrier 108 and the semiconductor tool 102.

Figure 9:
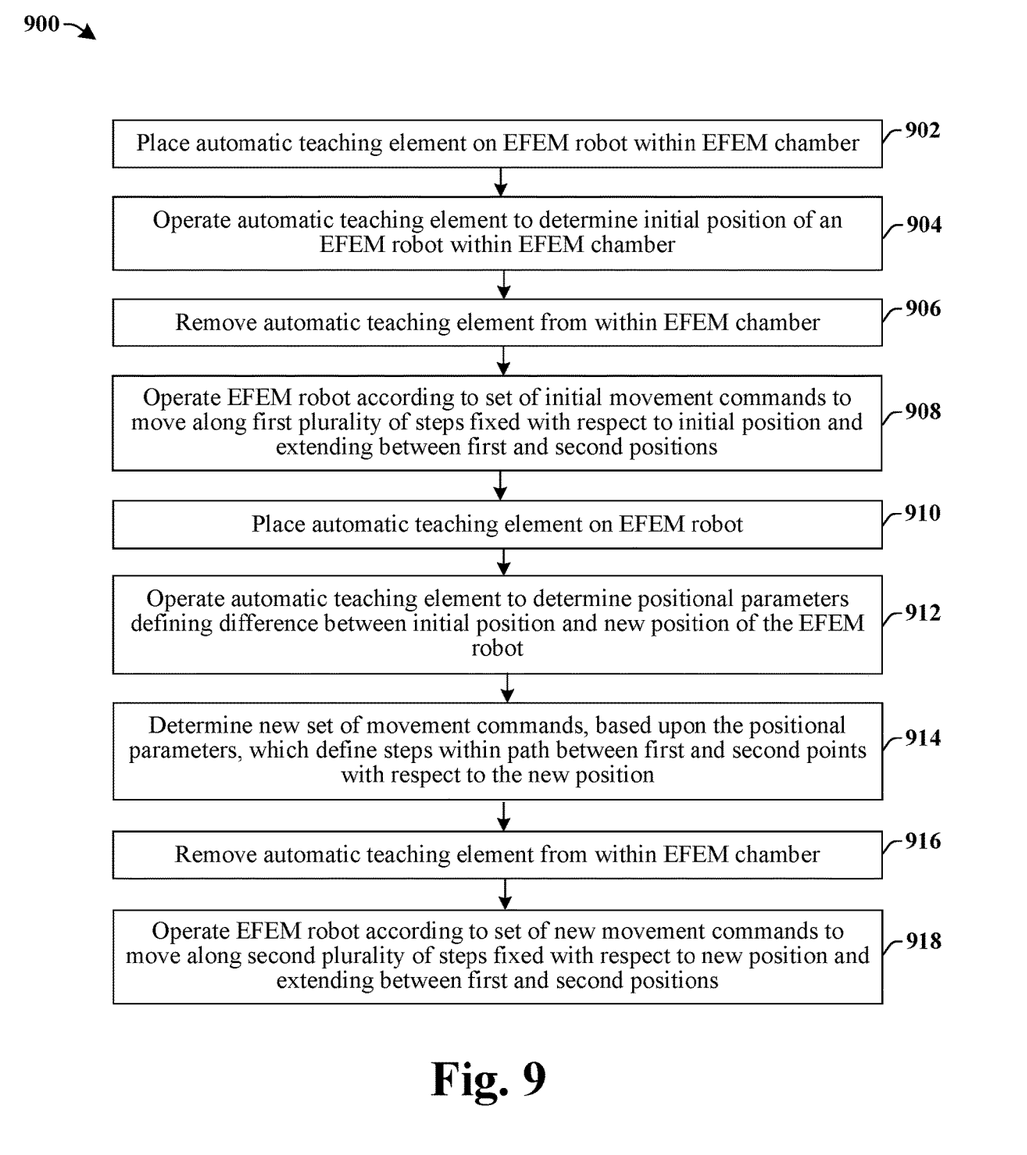
FIG. 9 illustrates a flow diagram of some embodiments of a method of using a portable automatic teaching element to automatically re-program an EFEM robot to account for positional changes of the EFEM robot.

FIG. 9 illustrates a flow diagram of some embodiments of a method 900 of using an automatic teaching element to automatically re-program an EFEM robot to account for positional changes of the EFEM robot.

At 902, an automatic teaching element is placed on an EFEM robot within an EFEM chamber. In some embodiments, the automatic teaching element is placed at a first location on the EFEM robot. FIG. 8A illustrates a cross-sectional view 800 of a block diagram showing an automatic teaching element being placed at a first location within an EFEM chamber, according to some embodiments of act 902.

At 904, the automatic teaching element is operated to measure an initial position of an EFEM robot within the EFEM chamber. When the EFEM robot is at the initial position, the EFEM robot is configured to move along a first plurality of steps that are fixed with respect to the initial position and that extend along a path between a first position and a second position.

At 906, the automatic teaching element is removed from the EFEM chamber. FIG. 8B illustrates a cross-sectional view 802 of a block diagram showing an automatic teaching element being removed from an alignment chamber, according to some embodiments of act 906.

At 908, the EFEM robot is operated according to set of initial movement commands to move along a first plurality of steps fixed with respect to the initial position and extending between first and second positions. FIG. 8B illustrates a cross-sectional view 804 of a block diagram showing an EFEM robot moving along a first plurality of steps, according to some embodiments of act 908.

At 910, the automatic teaching element is placed on the EFEM robot after operating the EFEM robot according to the set of initial movement commands. In some embodiments, the automatic teaching element is placed at the first location on the EFEM robot. FIG. 8C illustrates a cross-sectional view 806 of a block diagram showing the automatic teaching element being is placed at the first location within an EFEM, according to some embodiments of act 910.

At 912, the automatic teaching element is operated to determine positional parameters describing a difference between the initial position and a new position of the EFEM robot.

At 914, a set of new movement commands are generated based on the positional parameters. In some embodiments, the set of new movement commands may also be generated based on the initial position. The set of new movement commands define a second plurality of steps within the path between first and second positions with respect to the new positional parameters.

At 916, the automatic teaching element is removed from within the EFEM chamber. FIG. 8C illustrates a cross-sectional view 806 of a block diagram showing an automatic teaching element being removed from an alignment chamber, according to some embodiments of act 916.

At 918, the EFEM robot is operated according to a set of new movement commands to move along second plurality of steps fixed with respect to the new position and extending between the first and second positions. FIG. 8D illustrates a cross-sectional view 808 of a block diagram showing an EFEM robot moving along a second plurality of steps, according to act 918.

Although the method 900 describes the reprogramming of a single EFEM robot, it will be appreciated that the method may be applied to use a same teaching device (e.g., comprising a portable unit) to automatically re-program different EFEM robots associated with different EFEMs. For example, after the automatic teaching element is removed from within the EFEM chamberat the sixth time, the automatic teaching element may be placed within an additional EFEM chamber, where the automatic teaching element is configured to determine an additional position of an additional EFEM robot within the additional EFEM chamber.

Accordingly, in various embodiments the present disclosure relates to a method of automatically programming an EFEM robot to account for positional changes of the EFEM robot, and an associated apparatus.

In some embodiments, the present disclosure relates to a method of programming an EFEM robot. The method includes determining an initial position of an EFEM robot within an EFEM chamber, the EFEM robot at the initial position is configured to move along a first plurality of steps that are defined relative to the initial position and that extend along a path between a first position and a second position; determining positional parameters describing a change between the initial position and a new position of the EFEM robot within the EFEM chamber that is different than the initial position; and determining a second plurality of steps based upon the positional parameters, the EFEM robot at the new position is configured to move along the second plurality of steps that are defined relative to the new position and that extend along the path between the first position and the second position. In some embodiments, the positional parameters include a first positional parameter describing a first difference between the initial position and the new position along a first direction, a second positional parameter describing a second difference between the initial position and the new position along a second direction perpendicular to the first direction, a third positional parameter describing a third difference between the initial position and the new position along a third direction perpendicular to the first direction and to the second direction, and a fourth positional parameter describing a change in an orientation of the EFEM robot between the initial position and the new position. In some embodiments, determining the positional parameters includes determining the first positional parameter and the second positional parameter based on an offset of an alignment mark coupled to the EFEM chamber between the initial position and the new position, wherein the alignment mark is disposed along a plane extending in the first direction and the second direction. In some embodiments, the offset of the alignment mark is determined by comparison of a first image of the alignment mark corresponding to the initial position and a second image of the alignment mark corresponding to the new position. In some embodiments, one or more of the positional parameters is a distance offset along the third direction between the initial position and the new position determined by using one or more lasers. In some embodiments, one or more of the positional parameters is calculated as a function of a first distance measured using a first laser and a second distance measured using a second laser. In some embodiments, one or more of the positional parameters is an orientation of the EFEM robot calculated as a function of a first distance measured using a first laser and a second distance measured using a second laser. In some embodiments, the EFEM robot is configured to operate according to a set of initial movement commands that move the EFEM robot along the first plurality of steps. In some embodiments, the method further includes generating a set of new movement commands based upon the positional parameters, the EFEM robot is configured to operate according to the set of new movement commands to move the EFEM robot along the second plurality of steps. In some embodiments, the method further includes providing the set of new movement commands to a controller configured to operate the EFEM robot according to the set of new movement commands to move the EFEM robot along the second plurality of steps. In some embodiments, the method further includes placing an automatic teaching element within the EFEM chamber, the automatic teaching element is configured to determine the positional parameters; and removing the automatic teaching element from the EFEM chamber prior to using a semiconductor tool coupled to the EFEM chamber to perform a fabrication process on a substrate. In some embodiments, the method further includes placing the automatic teaching element within an additional EFEM chamber after removing the automatic teaching element from the EFEM chamber, the automatic teaching element is configured to determine an additional position of an additional EFEM robot within the additional EFEM chamber. In some embodiments, the first plurality of steps are separated from a point on the EFEM robot by a first plurality of distances, and the second plurality of steps are separated from the point on the EFEM robot by a second plurality of distances different than the first plurality of distances.

In other embodiments, the present disclosure relates to a method of programming an EFEM robot. The method includes determining an initial position of an EFEM robot, the EFEM robot at the initial position is configured to operate according to a set of initial movement commands to move along a first plurality of steps that are defined relative to the initial position and that extend between a first position and a second position; determining positional parameters describing a change between the initial position and a new position of the EFEM robot that is different than the initial position; and generating a set of new movement commands based upon the positional parameters, the EFEM robot at the new position is configured to operate according to the new set of movement commands to move along a second plurality of steps that are defined relative to the new position and that extend between the first position and the second position. In some embodiments, distances between the first plurality of steps and the initial position are different than distances between the second plurality of steps and the new position.

In yet other embodiments, the present disclosure relates to an EFEM robot automatic teaching element. The automatic teaching element includes a position measurement unit configured to determine an initial position of an EFEM robot within an EFEM chamber and a new position of the EFEM robot within the EFEM chamber that is different than the initial position; and a processing element configured to determine positional parameters describing a difference between the initial position and the new position, and to further determine a second plurality of steps from the positional parameters, which move the EFEM robot along a path extending between a first position and a second position. In some embodiments, the EFEM robot is configured to move along a first plurality of steps that are fixed relative to the initial position and that extend along the path between the first position and the second position. In some embodiments, the first plurality of steps are separated from a point on the EFEM robot by a first plurality of distances, and the second plurality of steps are separated from the point on the EFEM robot by a second plurality of distances different than the first plurality of distances. In some embodiments, the processing element is further configured to determine a set of new movement commands describing the path based upon the positional parameters. In some embodiments, the automatic teaching element further includes a communication interface configured to provide the set of new movement commands to the EFEM robot to change operation of the EFEM robot.

In yet other embodiments, the present disclosure relates to a method of programming an EFEM robot. The method includes placing an automatic teaching element within an EFEM chamber at a first time; operating the automatic teaching element at a second time, after the first time, to measure an initial position of an EFEM robot within the EFEM chamber; removing the automatic teaching element from within the EFEM chamber at a third time after the second time; placing the automatic teaching element within the EFEM chamber at a fourth time after the third time; operating the automatic teaching element at a fifth time, after the fourth time, to measure positional parameters describing a difference between the initial position and a new position of the EFEM robot within the EFEM chamber; and determining a second plurality of steps based upon the positional parameters, wherein the EFEM robot is configured to move along the second plurality of steps that extend along a path between a first position and a second position. In some embodiments, the method further includes placing the automatic teaching element at a first location within the EFEM chamber at the first time, and placing the automatic teaching element at the first location within the EFEM chamber at the fourth time. In some embodiments, the method further includes placing the automatic teaching element within an additional EFEM chamber after removing the automatic teaching element from the EFEM chamber, wherein the automatic teaching element is configured to determine an additional position of an additional EFEM robot within the additional EFEM chamber. In some embodiments, the EFEM robot is configured to move along a first plurality of steps between the third time and the fourth time, which extend along the path between the first position and the second position, and distances between the first plurality of steps and the initial position are different than distances between the second plurality of steps and the new position. In some embodiments, the EFEM robot is configured to operate according to a set of initial movement commands that move the EFEM robot along the first plurality of steps between the third time and the fourth time. In some embodiments, the method further includes generating a set of new movement commands based upon the positional parameters, wherein the EFEM robot is configured to operate according to the set of new movement commands to move the EFEM robot along the second plurality of steps after the fifth time. In some embodiments, the first position is within a carrier configured to hold one or more substrates and the second position is within a semiconductor tool In yet other embodiments, the present disclosure relates to an EFEM robot automatic teaching element. The automatic teaching element includes a memory element configured to store data describing an initial position of an EFEM robot within an EFEM chamber; a position measurement unit configured to take measurements describing a new position of the EFEM robot within the EFEM chamber that is different than the initial position of the EFEM robot; and a processing element is configured to determine a set of new movement commands describing a path of the EFEM robot based upon the data describing the initial position of the EFEM robot and the measurements. In some embodiments, the automatic teaching element further includes a housing surrounding the position measurement unit, the memory element, and the processing element. In some embodiments, the automatic teaching element further includes a coupling element fixed to the housing and configured to couple the housing to a surface of the EFEM robot. In some embodiments, the automatic teaching element further includes a communication interface configured to provide the set of new movement commands to a controller configured to control movement of a robotic arm of the EFEM robot or a teaching pendant in communication with the controller. In some embodiments, the position measurement unit includes an imaging device configured to capture an image of an alignment mark disposed on the EFEM chamber, and a distance measurement device configured to measure a first distance and a second distance between the automatic teaching element and the EFEM chamber. In some embodiments, the imaging device comprises a charge coupled device (CCD) camera. In some embodiments, the distance measurement device includes one or more lasers. In some embodiments, the distance measurement device includes a first laser configured to generate a first laser beam extending in a third direction; a second laser configured to generate a second laser beam extending in the third direction, the first laser is separated from the second laser along a first direction or a second direction by a non-zero separation; a first sensor configured to receive a reflection of the first laser beam from the EFEM chamber and to determine the first distance between the first laser and the EFEM chamber; and a second sensor configured to receive a reflection of the second laser beam from the EFEM chamber and to determine the second distance between the second laser and the EFEM chamber.

In yet other embodiments, the present disclosure relates to an EFEM robot automatic teaching element. The automatic teaching element includes an imaging device configured to capture images of an alignment mark disposed on an EFEM chamber at an initial position and at a new position of an EFEM robot (112), the images correspond to a first positional parameter describing a first positional change of the EFEM robot in a first direction and second positional parameter describing a second positional change of the EFEM robot in a second direction; and a distance measurement device configured to measure distances between the distance measurement device and the EFEM chamber at the initial position and at the new position, the distances correspond to a third positional parameter describing a third positional change of the EFEM robot in a third direction and fourth positional parameter describing a change in orientation of the EFEM robot. In some embodiments, the automatic teaching element further includes a processing element configured to receive the images from the imaging device and the first distance and the second distance from the distance measurement device, wherein the processing element is configured to determine the first positional parameter and the second positional parameter from the images and to determine the third positional parameter and the fourth positional parameter from the first distance and the second distance. In some embodiments, the processing element is configured to determine a set of new movement commands describing a path along which the EFEM robot moves between a first position and a second position based upon the first positional parameter, the second positional parameter, the third positional parameter, and the fourth positional parameter. In some embodiments, the automatic teaching element further includes a memory element configured to store data describing an initial position of the EFEM robot, wherein the first positional parameter describes at the first positional change between the initial position of the EFEM robot and at the new position of the EFEM robot. In some embodiments, the distance measurement device includes a first laser configured to generate a first laser beam extending in the third direction; a second laser configured to generate a second laser beam extending in the third direction, the first laser is separated from the second laser along the first direction or the second direction by a non-zero separation; a first sensor configured to receive a reflection of the first laser beam from the EFEM chamber and to determine the first distance from the reflection; and a second sensor configured to receive a reflection of the second laser beam from the EFEM chamber and to determine the second distance from the reflection, the first sensor is separated from the second sensor along the first direction or the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of programming an EFEM robot, comprising:
    determining an initial position of an EFEM robot within an EFEM chamber;
    operating the EFEM robot at the initial position to move a first substrate along a first plurality of steps that are defined relative to the initial position and that extend along a path between a first position and a second position;
    determining positional parameters describing a change between the initial position and a new position of the EFEM robot within the EFEM chamber that is different than the initial position;
    determining a second plurality of steps based upon the positional parameters; and
    operating the EFEM robot at the new position to move a second substrate along the second plurality of steps that are defined relative to the new position and that extend along the path between the first position and the second position.

2. The method of claim 1, wherein the positional parameters comprise:
    a first positional parameter describing a first difference between the initial position and the new position along a first direction;
    a second positional parameter describing a second difference between the initial position and the new position along a second direction perpendicular to the first direction;
    a third positional parameter describing a third difference between the initial position and the new position along a third direction perpendicular to the first direction and to the second direction; and
    a fourth positional parameter describing a change in an orientation of the EFEM robot between the initial position and the new position.

3. The method of claim 2, wherein determining the positional parameters comprises:
    determining the first positional parameter and the second positional parameter based on an offset of an alignment mark coupled to the EFEM chamber between the initial position and the new position, wherein the alignment mark is disposed along a plane extending in the first direction and the second direction.

4. The method of claim 3, wherein the offset of the alignment mark is determined by comparison of a first image of the alignment mark corresponding to the initial position and a second image of the alignment mark corresponding to the new position.

5. The method of claim 3, wherein one or more of the positional parameters is a distance offset along the third direction between the initial position and the new position determined by using one or more lasers.

6. The method of claim 1, wherein one or more of the positional parameters is calculated as a function of a first distance measured using a first laser and a second distance measured using a second laser.

7. The method of claim 1, wherein one or more of the positional parameters is an orientation of the EFEM robot calculated as a function of a first distance measured using a first laser and a second distance measured using a second laser.

8. The method of claim 1, wherein the EFEM robot is configured to operate according to a set of initial movement commands that move the EFEM robot along the first plurality of steps.

9. The method of claim 8, further comprising:
    generating a set of new movement commands based upon the positional parameters, wherein the EFEM robot is configured to operate according to the set of new movement commands to move the EFEM robot along the second plurality of steps.

10. The method of claim 9, further comprising:
    providing the set of new movement commands to a controller configured to operate the EFEM robot according to the set of new movement commands to move the EFEM robot along the second plurality of steps.

11. The method of claim 1, further comprising:
    placing an automatic teaching element within the EFEM chamber, wherein the automatic teaching element is configured to determine the positional parameters; and
    removing the automatic teaching element from the EFEM chamber prior to using a semiconductor tool coupled to the EFEM chamber to perform a fabrication process on the second substrate.

12. The method of claim 11, further comprising:
    placing the automatic teaching element within an additional EFEM chamber after removing the automatic teaching element from the EFEM chamber, wherein the automatic teaching element is configured to determine an additional position of an additional EFEM robot within the additional EFEM chamber.

13. The method of claim 1,
    wherein the first plurality of steps are separated from a point on the EFEM robot by a first plurality of distances; and
    wherein the second plurality of steps are separated from the point on the EFEM robot by a second plurality of distances different than the first plurality of distances.

14. A method of programming an EFEM robot, comprising:
    determining an initial position of a base of an EFEM robot, wherein the EFEM robot is configured to operate according to a set of initial movement commands when the base is at the initial position, the set of initial movement commands configured to move the EFEM robot along a first plurality of steps that are defined relative to the initial position and that extend between a first position and a second position;
    determining positional parameters describing a change between the initial position and a new position of the base of the EFEM robot that is different than the initial position; and
    generating a set of new movement commands based upon the positional parameters, wherein the EFEM robot is configured to operate according to the new set of movement commands when the base is at the new position, the new set of movement commands configured to move the EFEM robot along a second plurality of steps that are defined relative to the new position and that extend between the first position and the second position.

15. The method of claim 14, further comprising:
determining the positional parameters based on an offset of an alignment mark coupled to an EFEM chamber, wherein the EFEM robot is disposed within the EFEM chamber.

16. An EFEM (equipment front end module) automatic teaching element, comprising:
a position measurement unit configured to determine an initial position of a base of an EFEM robot within an EFEM chamber and a new position of the base of the EFEM robot within the EFEM chamber that is different than the initial position; and
a processing element configured to determine positional parameters describing a difference between the initial position and the new position, and to further determine a second plurality of steps from the positional parameters, which move the EFEM robot along a path extending between a first position and a second position.

17. The automatic teaching element of claim 16, wherein the EFEM robot is configured to move along a first plurality of steps that are fixed relative to the initial position and that extend along the path between the first position and the second position.

18. The automatic teaching element of claim 16,
wherein the EFEM robot comprises a plurality of segments configured to rotate around a plurality of axes of rotation; and
wherein the base of the EFEM robot is below a bottom-most axis of rotation.

19. The automatic teaching element of claim 16, wherein the processing element is further configured to determine the positional parameters based on an offset of an alignment mark coupled to the EFEM chamber.

20. The automatic teaching element of claim 19, further comprising:
a communication interface configured to provide a set of new movement commands to the EFEM robot to change operation of the EFEM robot.

* * * * *